(12) United States Patent
Chen et al.

(10) Patent No.: US 8,208,316 B2
(45) Date of Patent: Jun. 26, 2012

(54) SRAM YIELD ENHANCEMENT BY READ MARGIN IMPROVEMENT

(75) Inventors: Nan Chen, San Diego, CA (US); Chang Jung, San Diego, CA (US); Zhiqin Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 298 days.

(21) Appl. No.: 12/194,142

(22) Filed: Aug. 19, 2008

(65) Prior Publication Data

US 2010/0046280 A1  Feb. 25, 2010

(51) Int. Cl.
*G11C 7/06* (2006.01)
(52) U.S. Cl. ............... 365/189.07; 365/200; 365/225.7; 365/230.06
(58) Field of Classification Search .............. 365/156, 365/154, 190, 177
See application file for complete search history.

(56) References Cited

U.S. PATENT DOCUMENTS

| 5,963,495 | A | 10/1999 | Kumar |
| 5,966,319 | A * | 10/1999 | Sato ............................ 365/154 |
| 6,072,738 | A | 6/2000 | Brown |
| 6,118,728 | A * | 9/2000 | Casper et al. ............ 365/230.06 |
| 6,147,514 | A | 11/2000 | Shiratake |
| 6,586,294 | B1 | 7/2003 | Post et al. |
| 2005/0002258 | A1 * | 1/2005 | Iwase et al. .................. 365/222 |
| 2008/0002497 | A1 | 1/2008 | Barth, Jr. et al. |
| 2008/0061371 | A1 | 3/2008 | Kang et al. |

OTHER PUBLICATIONS

International Search Report—PCT/US2009/054028, International Search Authority—European Patent Office Oct. 22, 2009.
Written Opinion—PCT/US20091054028, International Search Authority—European Patent Office Oct. 22, 2009.

* cited by examiner

*Primary Examiner* — Jason Lappas
(74) *Attorney, Agent, or Firm* — Michelle Gallardo; Nicholas J. Pauley; Jonathan T. Velasco

(57) ABSTRACT

A sense margin is improved for a read path in a memory array. Embodiments improve the sense margin by using gates with a lower threshold voltage in a read column multiplexer. A cross coupled keeper can further improve the sense margin by increasing a voltage level on a bit line storing a high value, thereby counteracting leakage on the "high" bit line.

11 Claims, 6 Drawing Sheets

SRAM YIELD ENHANCEMENT BY READ MARGIN IMPROVEMENT

TECHNICAL FIELD

The disclosure relates in general to semiconductor devices, and in specific to memory arrays.

BACKGROUND

Memory devices are very complex. Even the smallest process variations can lead to improperly functioning devices. As memory components become smaller, more process variation occurs.

Memory read operations are particularly affected by process variation. Too much process variation can result in an inaccurate read operation.

Conventionally, a sense amplifier reads voltage levels from two bit lines (a bit line and a bit line bar) connected to the memory cell being read. The sense amplifier analyzes the difference between the two bit line voltages to determine what value is stored in the memory cell. The difference is known as a sense margin (or read margin).

The sense margin needs to be large enough to guarantee a proper read operation. With smaller memory devices, it is even more important to ensure the sense margin remains sufficient as more process variations occur with the smaller memory devices. Similarly, with lower power devices it is also more difficult to maintain a proper sense margin.

Column multiplexers within a memory device can degrade the sense margin. CMOS column multiplexers may not affect the sense margin but they have other drawbacks. For example, CMOS devices require more area than pMOS devices. Moreover, CMOS multiplexers increase the bit line capacitance.

Although pMOS column multiplexers address the above noted problems with CMOS column multiplexers, pMOS column multiplexers decrease voltage in the bit lines, reducing the sense margin. Although timing can be delayed to increase the sense margin, the delay degrades overall performance of the memory by increasing access time.

Other variables can also affect the sense margin. For example, process variation and/or operating conditions can worsen the sense margin. During the early stage of implementing a new technology, large process variations can exist. Operations in extreme or corner conditions such as a low temperature, e.g., −40 deg C., and/or low Vdd voltage, can result in read margin failures of the weak bit cells.

Thus, it would be desirable to have a memory device that does not decrease sense margins, while still addressing the problems noted above.

BRIEF SUMMARY

Reducing voltage threshold in a pMOS column multiplexer increases a sense margin in a memory read operation. The lower voltage threshold transistors can be created with the same mask used for other components in the memory, thus saving a mask. The various embodiments as described herein may be used to improve the operations of electronic devices. Devices, systems, and methods described herein may lead to improved read margins in gates used in a read path of a memory array.

One embodiment is a method for altering read margin in an electronic memory circuit. The method includes applying an existing mask layer to an existing column multiplexer circuit to fabricate a new column multiplexer circuit having lower threshold voltage transistors. The existing mask layer changes a threshold voltage of transistors in the column multiplexer circuit. The lower threshold voltage transistors alter the read margin by altering column multiplexer output voltage levels of the new column multiplexer circuit.

Another embodiment is a memory that comprises a memory array that stores data; and a read memory path the reads the stored data. The read memory path includes a read column multiplexer having at least one LVT type transistor that improves a read margin.

A further embodiment uses a keeper circuit to aid in holding the voltage levels at the sense amplifier. The keeper circuit assists in maintaining the sense margin.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Embodiments described herein involve increasing a read margin by decreasing a threshold voltage of transistors (such as a pFET) in the column multiplexer of a memory device. A mask for transistors used in other components of the memory is used to create the lower threshold voltage transistors, thus saving a mask layer.

Figure 1:
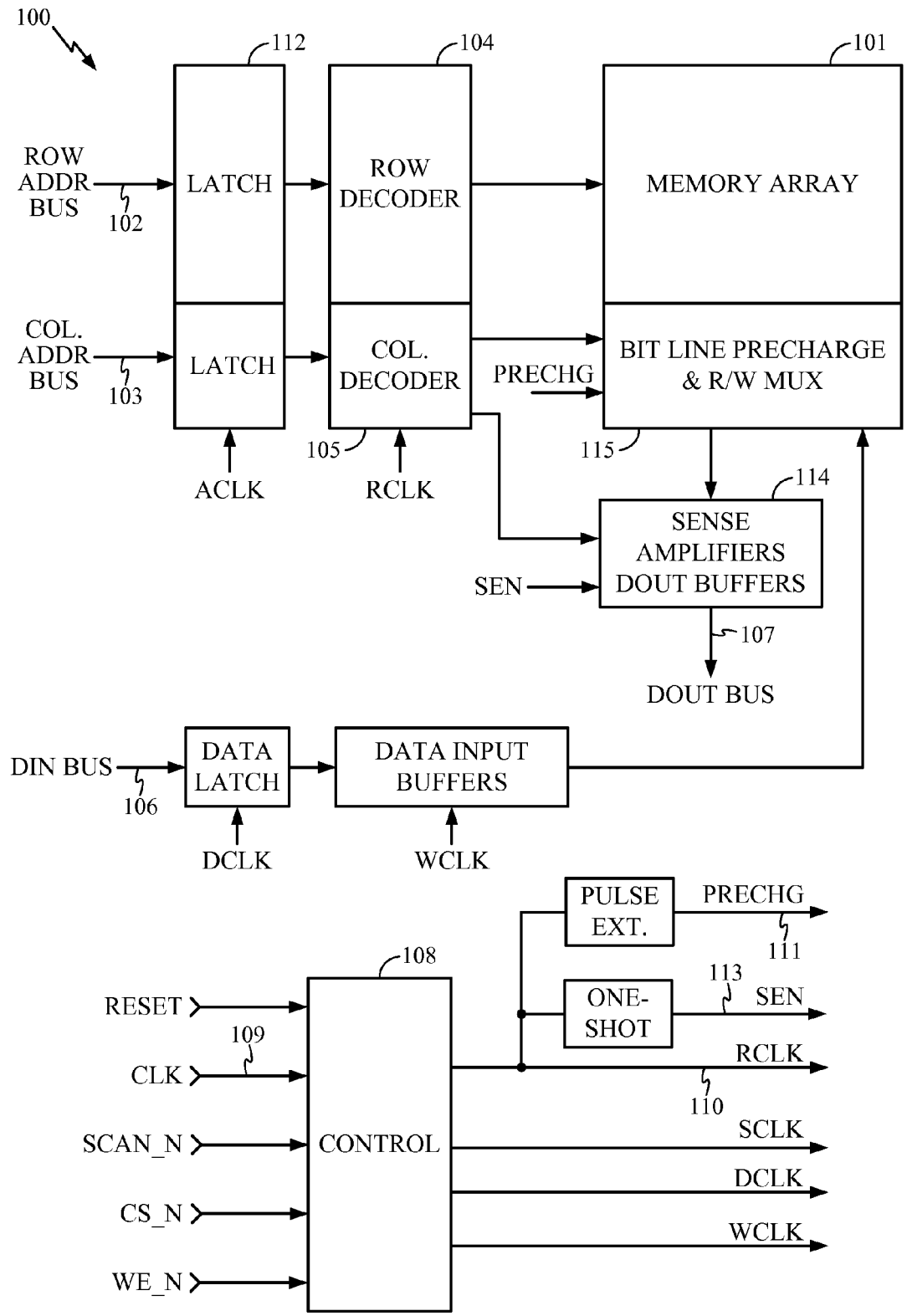
FIG. 1 is a block diagram depicting a conventional memory device.

FIG. 1 shows a typical memory device 100, which is a static random access memory (SRAM) device and includes memory array 101. A row address 102 and column address 103 are provided to their respective decoders 104,105 (via latches 112) for activating a portion of the array 101. Data to be written into the memory array 101 is provided along a write path 106. Data to be read from the array 101 is provided to the read path 107. Column multiplexers 115 control which bit lines are connected to the sense amplifiers 114.

A typical read operation for the device 100 is as follows. At the active edge of a clock signal, an internal clock (RCLK) rising edge is generated, and the input addresses 102, 103 are latched into the latches 112. The input addresses will select a word line of the memory array 101. Appropriate bit lines of the array 101 are matured while the word line remains selected. The RCLK falling edge will trigger a sense amplifier enable signal (SEN) so the sense amplifiers 114 will receive the matured bit line signals via the column multiplexer 115. Also, at this time, the word line is disabled. The latched sense amplifier 114 will then sense from the matured bit line differential voltage and pass the read data to data latch and DOUT on the read path 107.

Figure 2:
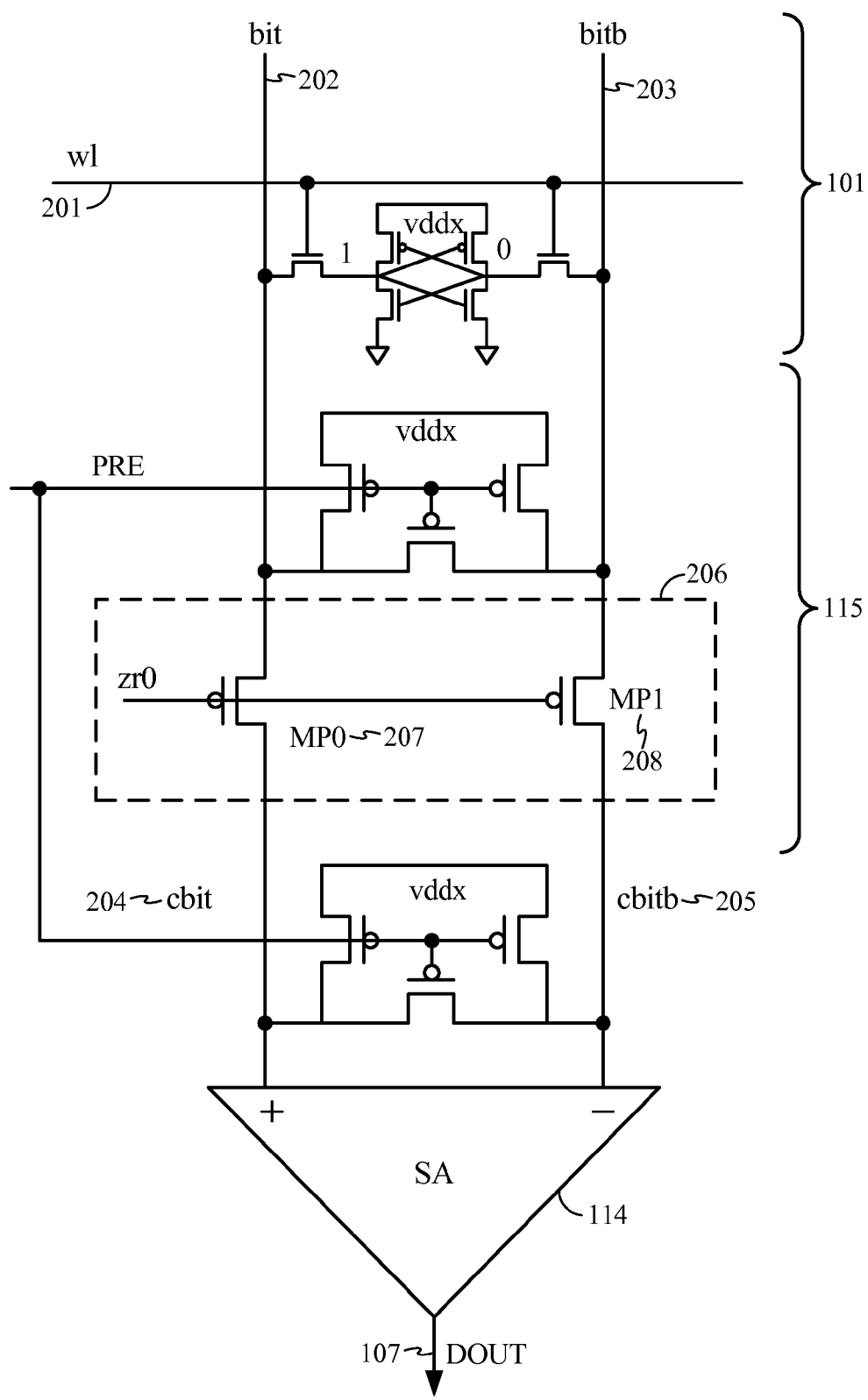
FIG. 2 is a block diagram of a portion of a read path of the memory device of FIG. 1.

FIG. 2 depicts portions of the memory device 100 used in a read operation to read the data on a word line 201 indicated by the addresses 102 and 103. Assuming the word line 201 is asserted, the bit line 202 will read as 1 and the bitb line 203 will be read as 0. The data on the bit and bitb lines 202 and 203 is then passed to the column multiplexer 206. The column multiplexer 206 selects the matured bit lines for sensing. The column multiplexer 206 includes pMOS gates MP0 207 and MP1 208 that are regular voltage threshold (RVT) pFET transistors. The portions of the bit and bitb lines 202, 203 after the pMOS gates 207, 208 will be referred to as cbit 204 and cbitb 205. As noted above, pMOS column multiplexers degrade voltage in the bit lines so that the bit line portions cbit 204, cbitb 205 are degraded relative to bit line 202 and bitb line 203. Thus, the sense (or read) margin is reduced, possibly resulting in erroneous operations.

Figure 3:
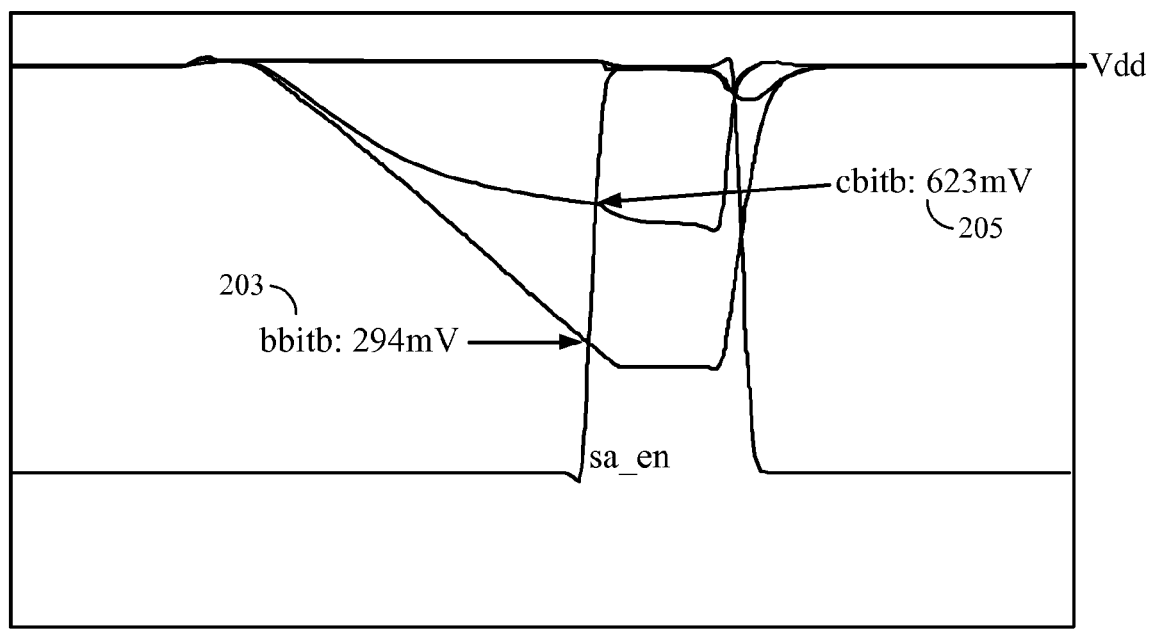
FIG. 3 is waveform diagram depicting the voltages of the bit lines of the read path of FIG. 2.

For example, FIG. 3 depicts a waveform graph showing the voltage separation of the bit lines in the read path of FIG. 2. In this example, the bitb line 203 should be reading a logical '0'. The voltage corresponding to this value transmits through the gate 208 to the portion of the bitb line 203 referred to as the cbitb line 205. The sense amplifier 114 then senses the voltage on the cbitb line 205.

As shown in the graph, the bitb line 203 voltage extends down to 294 mV before the sense enable signal is asserted. This represents an ideal level to be passed to the sense amplifier 114. An ideal sense margin results from the difference between Vdd, in this example 940 mV and the value of the bitb line 203, in this example, 294 mV, which is 646 mV.

However, because of the type of gate being used in the read multiplexer 206, the MP1 gate 208 has only passed 623 mV as the value to the cbitb line 205. The voltage on the cbitb line 205 saturates at the threshold voltage of the MP1 gate 208. As shown, the cbit and cbitb lines' separation degrades from the bit and bitb lines' separation. Consequently, the sense margin based upon the cbitb line 205 in this read path is 940 mV−623 mV, or 317 mV. This sense margin may be too low for proper operations, resulting in read margin failures.

Figure 4:
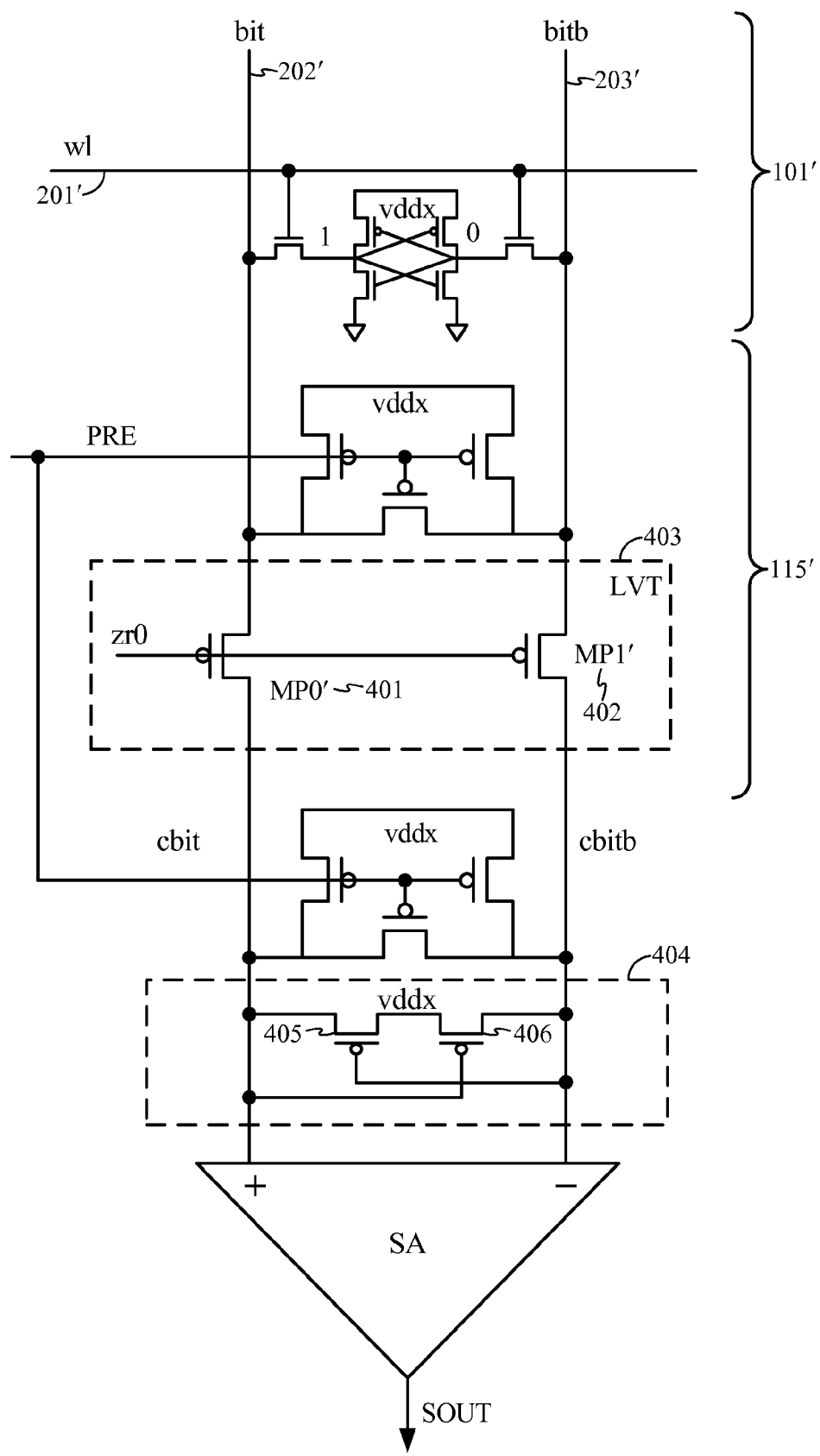
FIG. 4 is a block diagram showing a portion of a read path of a memory device, according to embodiments of the invention.

FIG. 4 depicts an embodiment that uses pFET type gates in the read column multiplexer. Some aspects of FIG. 4 are similar to those shown in FIG. 2, and thus are indicated with a prime mark, for example bitb line is labeled 203'. Note that pMOS type devices are typically associated with read operations, e.g. read column multiplexers, while nMOS type devices are typically associated with write operations, e.g. write column multiplexers. Embodiments of the invention are described in terms of read column multiplexers, and hence pMOS type pFETs. Other embodiments of the invention may be used for write column multiplexers, and hence nMOS type nFETs.

FIG. 4 includes gates MP0' 401 and MP1' 402 in the read column multiplexer 403. Gates 401 and 402 are different from gates 207 and 208. One embodiment may have the gates 401 and 402 be low threshold voltage (LVT) type gates for example 70-100 mV lower than the gates MP0 207, MP8 208. The gates are preferably pMOS type pFETs. The lower threshold voltage will cause the bitb line voltage to drop closer to the ideal voltage, and thus will increase the sense margin. Another embodiment may have the gates 401 and 402 be nFET type gates, particularly for write column multiplexers. For example, in a 45 nm device design, the LVT pFET has a threshold voltage about 100 mV lower than RVt pFET, and LVT nFET has a threshold voltage about 100 mV lower than RVt nFET. Although lower threshold voltage gates are typically subject to leakage issues, in a column multiplexer leakage is generally not a problem.

Another embodiment is to improve the sense margin by using a negative gate bias to drive the MP0 and MP1 pFETs. For example, if using a pMOS gate voltage of −100 mV, the cbit (output of a column mux) margin is improved.

Figure 5:
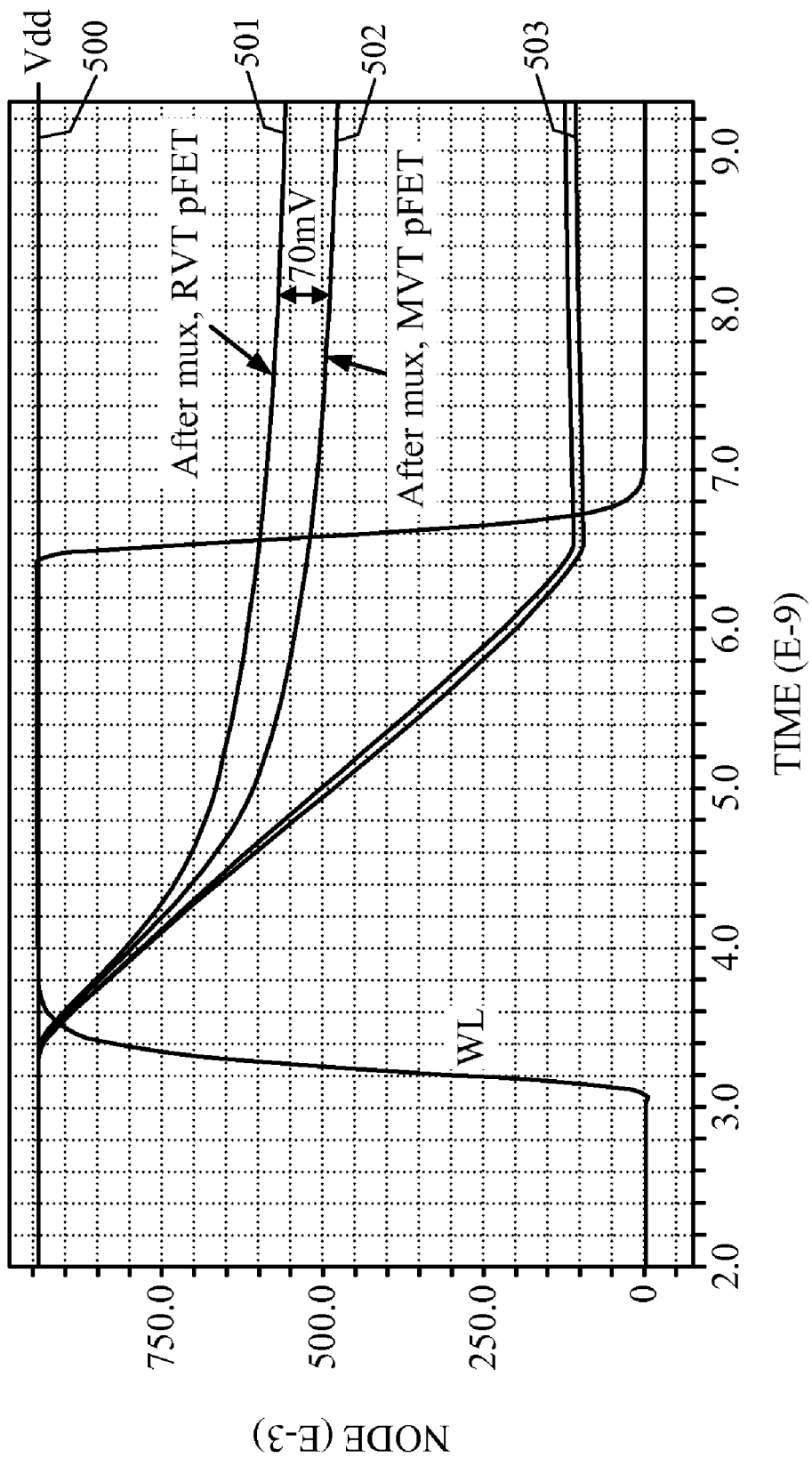
FIG. 5 is waveform diagram depicting the voltages of the bit lines of the read path of FIG. 4.

FIG. 5 depicts a waveform graph comparing the voltage separation of the bit lines in the read path of FIG. 4. In this graph the x axis represents time (in nanoseconds) and the Y axis represents voltage (in mV). In this example, the bitb line is reading a logical '0'. The Vdd voltage is shown by line 500. The bitb voltage is shown by line 503. The cbitb voltage is shown by line 501 for a RVT pFET type gate, e.g. gate 208, while line 502 represents the cbitb voltage for LVT pFET type gate, e.g. gate 402. Note that the sense margin is improved about 30-70 mV, depending upon the sense time. The increased sense margin reduces the chance of read margin failure. Thus, using gates 401 and 402 will reduce the bit line separation degradation after the read column multiplexer, thus increase the read margin and improve memory yield.

FIG. 4 also includes a cross-coupled keeper 404, which operates to maintain the voltage level on the high bit line by reducing voltage loss due to leakage. The cross coupled keeper 404 will improve the read margin by sustaining the high side that is provided to the sense amplifier. Transistors 405 and 406 have their sources connected to Vddx and their drains respectively connected to bit and bitb lines 202' and 203'. The gates are connected to the opposite bit line, such that the transistor 405 is controlled by the bitb line 203' and the transistor 406 is controlled by the bit line 202'. Thus, when the bit line 202' is high, the bitb line 203' will be low, which in turn activates the transistor 405 to connect the bit line 202' to Vddx. This assists in maintaining the bit line 202' at Vdd to counter losses from leakage paths that would degrade the voltage of the bit line 202'. The keeper 404 provides a better voltage difference for the sense amplifier to detect. Similarly, when the bit line 203' is high and the bitb line 202' is low, the transistor 406 is activated to connect the bit line 203' to Vddx.

Figure 6:
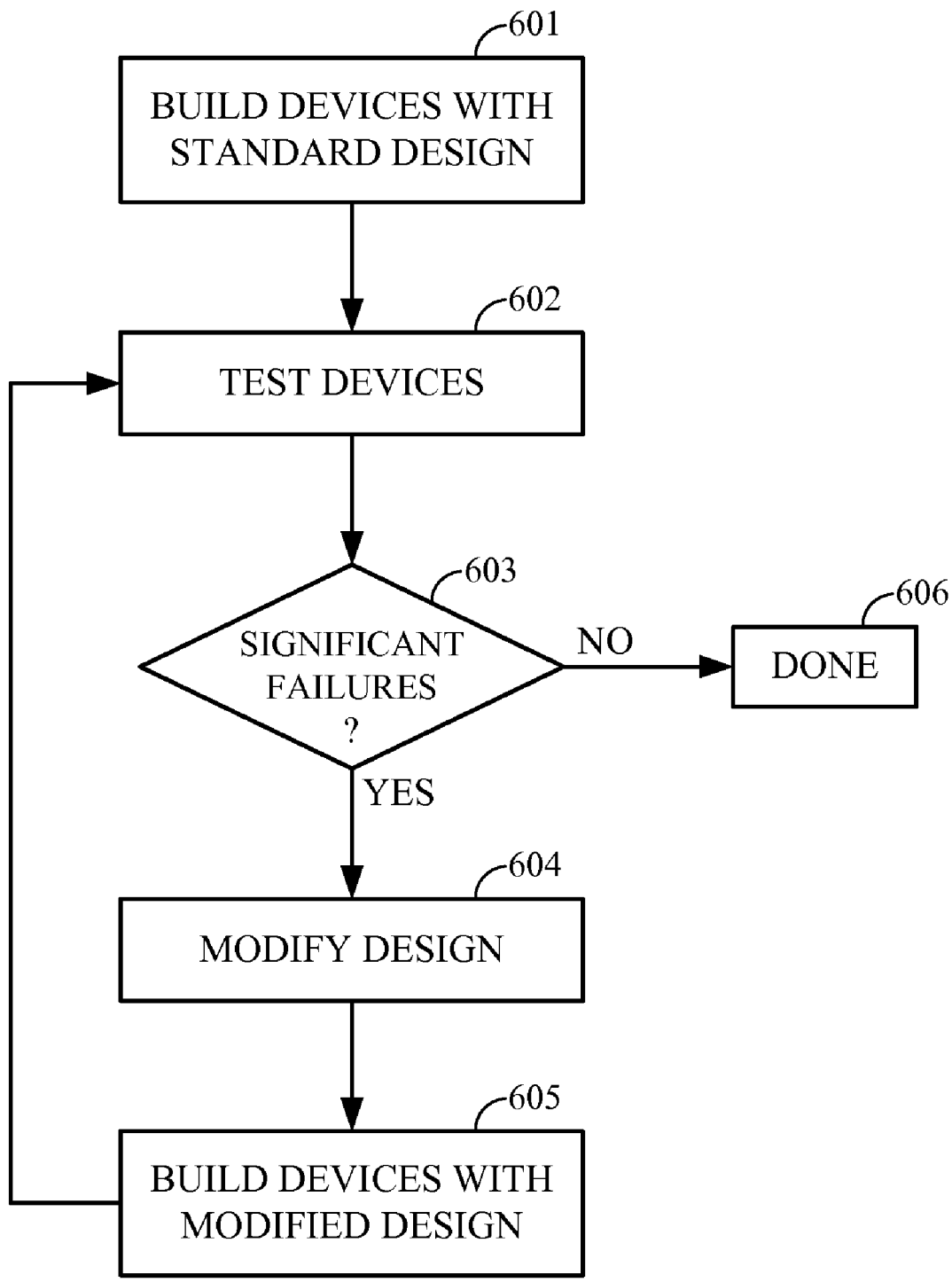
FIG. 6 is a flow chart of an exemplary process involved with the formation of the read path of FIG. 4.

FIG. 6 depicts an exemplary process that involves the embodiments shown in FIG. 4. The process begins in block 601 by building devices using a standard design, e.g. using a 45 nm device design having RVT type gates in the column multiplexers. The devices are then tested in block 602 using standard techniques. If there are a significant percent of failures, e.g. 5%, then the design should be modified to change the gates as described above, namely changing the RVT type pFETs to LVT type pFETs, and changing RVT nFETS to LVT nFETS. This type of change to the design may only require mask level changes. In other words, to change the gate type may only require a substitution of a different mask in the process, with no other design or process changes needed. Also note that the design may initially use LVT type FETs in the column multiplexers. The column multiplexer FETs may be formed during the same processing steps as other FETs, such as FETs in other peripheral memory circuitry. This would save at least one mask level and reduce manufacturing costs.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory comprising:
   a memory array that stores data;
   at least a first bit line and a second bit line in communication with the memory array;
   at least one column multiplexer configured to access the memory array via the first and second bit lines and output a first voltage on a first bit line output and a second voltage on a second bit line output; and
   at least one low threshold voltage (LVT) type transistor in the at least one column multiplexer, a reduced threshold voltage of the LVT type transistor increasing a read margin of the memory by increasing a differential between the first voltage and the second voltage after a predetermined activation period.

2. The memory of claim 1, wherein the LVT transistor uses a negative gate bias.

3. The memory of claim 1, wherein the LVT transistor has a gate threshold voltage less than a regular voltage threshold (RVT) transistor threshold voltage.

4. The memory of claim 1, wherein the LVT transistor comprises:
   a pMOS type FET.

5. The memory of claim 1, wherein the LVT transistor comprises:
   nMOS type FET.

6. The memory of claim 1, wherein the LVT transistor is formed concurrently with a transistor located in a memory array.

7. The memory of claim 1, further comprising a cross coupled keep circuit that further increases the read margin by maintaining a voltage level on a bit line sensed by a sense amplifier.

8. The memory of claim 1, wherein the memory comprises a static random access memory (SRAM).

9. A memory comprising:
   at least one pair of bit lines including a first bit line and a second bit line;
   a first bit line output and a second bit line output;
   at least one low voltage threshold (LVT) transistor having at least one LVT terminal configured to receive a signal from at least one of said first and second bit lines and at least one LVT second terminal configured to output a signal on said at least one of said first and second bit line outputs; and
   said first bit line output configured to have a first voltage, said second bit line output configured to have a second voltage, a differential between said first voltage and said second voltage defining a read margin, and a reduced threshold voltage of said at least one LVT transistor configured to increase said read margin of the memory by increasing the differential between the first voltage and the second voltage after a predetermined activation period.

10. A memory comprising:
    means for storing data;
    at least a first means and a second means for communicating with the means for storing data;
    means for accessing the means for storing data via the first and second means and outputting a first voltage on a first output of the first means and a second voltage on a second output of the second means; and
    at least one low threshold voltage (LVT) type transistor in the accessing means, a reduced threshold voltage of the LVT type transistor increasing a read margin of the memory by increasing a differential between the first voltage and the second voltage after a predetermined activation period.

11. A memory comprising:
    at least a first means and a second means for communicating with the memory, the first means having a first output and the second means having a second output; and
    at least one low voltage threshold (LVT) transistor having at least one LVT first terminal means for receiving a signal from at least one of said first and second means and at least one LVT second terminal means for outputting a signal on the at least one of said first and second means;
    wherein the first output is configured to have a first voltage, the second output is configured to have a second voltage, and a differential between the first voltage and the second voltage defines the read margin, and a reduced threshold voltage of the at least one LVT transistor configured to increase said read margin of the memory by increasing the differential between the first voltage and the second voltage after a predetermined activation period.

* * * * *